United States Patent [19]

Radack, Jr.

[11] Patent Number: 5,168,425
[45] Date of Patent: Dec. 1, 1992

[54] MOUNTING ARRANGEMENTS FOR HIGH VOLTAGE/HIGH POWER SEMICONDUCTORS

[75] Inventor: Stephen T. Radack, Jr., Erie, Pa.
[73] Assignee: General Electric Company, Erie, Pa.
[21] Appl. No.: 778,428
[22] Filed: Oct. 16, 1991
[51] Int. Cl.[5] ............................................. H05K 7/20
[52] U.S. Cl. .................................. 361/386; 361/388; 257/712
[58] Field of Search .......................... 357/79, 80, 81; 361/386–387

[56] References Cited

U.S. PATENT DOCUMENTS

| | | | |
|---|---|---|---|
| 3,896,542 | 7/1975 | Dale | 29/588 |
| 4,224,663 | 9/1980 | Maiese et al. | 357/79 |
| 4,404,739 | 9/1983 | Kiley et al. | 29/588 |
| 4,414,562 | 11/1983 | Kiley et al. | 357/81 |
| 4,660,868 | 4/1987 | Totani | 285/345 |
| 4,769,744 | 9/1988 | Neugebauer et al. | 357/79 |
| 4,853,828 | 1/1989 | Penn | 357/79 |
| 4,965,658 | 10/1990 | Norbeck et al. | 357/79 |

Primary Examiner—Gregory D. Thompson
Attorney, Agent, or Firm—R. Thomas Payne

[57] ABSTRACT

A mounting arrangement for a pair of relatively high voltage, press-pack semiconductors positioned in spaced apart relationship on a support surface of a heat sink comprises an enclosure formed of electrically insulative material having a mounting surface mating with the heat sink support surface. The arrangement has a pair of spaced openings extending through the mounting surface, each of which is configured for relatively accurately positioning a respective one of the semiconductors. A groove circumscribes each opening with a third groove spaced from and circumscribing the pair of grooves on the mounting surface. An O-ring in each groove defines an area between the grooves isolated from environmental contaminants when the enclosure is clamped to the heat sink. An electrically conductive mounting plate is positioned in each opening and electrically insulated from the heat sink but electrically connected to a respective semiconductor. A relatively stiff spring bar extends between the semiconductors with opposite ends of the bar supported upon a respective one of the semiconductors. The heat sink and the bar are coupled tensioning the bar toward the heat sink compressing the semiconductors between ends of the bar and the heat sink. The tensioning device comprises a bolt extending through an aperture in the heat sink, the enclosure mounting surface, and the bar between the semiconductors. Another groove circumscribes the aperture in the enclosure mounting surface and an O-ring positioned therein environmentally isolating the aperture from the area between the grooves when the enclosure is affixed to the heat sink.

17 Claims, 3 Drawing Sheets

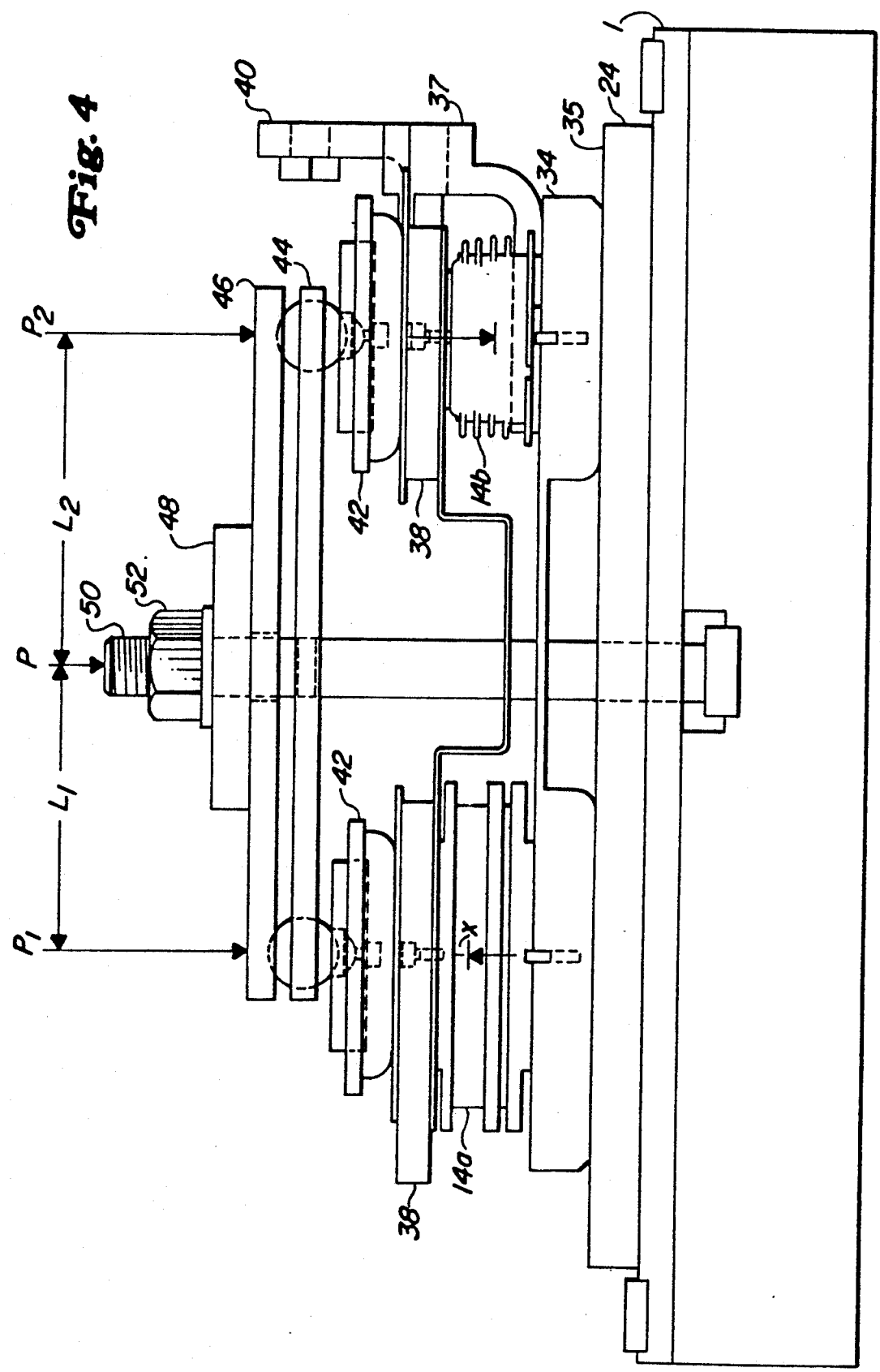

MOUNTING ARRANGEMENTS FOR HIGH VOLTAGE/HIGH POWER SEMICONDUCTORS

The present invention relates to mounting arrangements for high voltage/high power semiconductors.

BACKGROUND OF THE INVENTION

It is common practice for traction vehicles, such as transit vehicles, locomotives, and off-highway trucks, to be powered by either direct current (DC) or alternating current (AC) electric motors. The power developed by such motors may be as high as 2600 horsepower (HP) per motor. Such high HP motors require commensurate high, controlled electric power. For example, a nominal power requirement may be 750 volts at 1000 amperes during a propulsion mode of operation. During electrical braking of the traction vehicle, the motors may be operated as generators and produce even higher voltage and current. In the case of an AC electric motor operating as a generator, the peak voltage may routinely exceed 1000 volts.

The power control systems for such electric traction motors typically utilize power semiconductor devices, such as gate turn-off thyristors, for controlling power flow to and from the motors. Due to the magnitude of power being controlled, there is a significant amount of heat that must be dissipated by the semiconductor devices. Such heat is generally handled by mounting the semiconductors on relatively large heat sinks. The heat sinks are massive metal conductors having good thermal characteristics and sufficient surface area to dissipate sufficient heat to maintain the semiconductors within their operating temperature limits.

It is desirable, for safety reasons, that such large heat sinks be maintained at electrical ground potential. Conversely, the semiconductors are connected to high potentials. Accordingly, some form of electrical insulation must be provided between the semiconductors and the heat sink. This insulation is conventionally sheet material having good thermal characteristics, since it is positioned between the semiconductors and the heat sink, and one such material is available under the trade name of Chotherm. Such material is believed to be boron nitride material with a silicon binder. The semiconductors are clamped onto the heat sink with the insulation material clamped therebetween. One problem with this arrangement is that any path along the surface of the insulation sheet between the semiconductors and the heat sink must be established to have a length to prevent voltage breakdown due to creepage, where creepage is defined as the conduction of electricity across the surface of an insulator or dielectric. The creep distance, i.e., the shortest distance across the insulator surface between two conductors of different potential, is established empirically and, in an exemplary system, may require as much as two inches to effectively isolate conductors having a difference in potential of 1000 volts. This creep distance requirement has necessitated that enclosures for high power semiconductors be large and cumbersome and utilize large areas of expensive sheet insulation.

Prior art methods of mounting of semiconductors within enclosures has further exacerbated the size requirements for such enclosures. In particular, it is common practice to mount the semiconductors by individually clamping the semiconductors to the heat sink. The semiconductors of this power requirement are preferably packaged in "press packs" in which the cathode and anode terminals are large, flat surfaces on opposite ends of the semiconductors. Since the clamps are necessarily coupled to the heat sink, any calculation of creep distance includes spacing of the clamps from the semiconductors. Individual clamps are especially required where adjacent semiconductors may be clamped at different pressures. Thus, it is also desirable to provide a method and apparatus for mounting semiconductors which reduces the number of clamps while allowing different mounting pressures to be applied by a single clamp.

SUMMARY OF THE INVENTION

The above and other desirable features are attained in the present invention in a mounting arrangement for at least a pair of relatively high voltage, press packed semiconductors in which the semiconductors are positioned within an electrically insulated enclosure which is mounted upon a metallic heat sink. The heat sink is maintained at ground potential and the semiconductors, while connected in thermal relationship to the heat sink, are electrically isolated therefrom. In a preferred form, the heat sink is provided with a raised platform on its upper surface which fits within a cutout portion on the bottom of the insulative enclosure. Concentric with the cutout portion is an opening passing interiorly of the enclosure upon which the semiconductor is mounted. A mounting plate is positioned on the raised platform of the heat sink and fits within the aperture passing through the adjacent surface of the enclosure. An insulative sheet film material is placed over the raised platform to isolate the mounting plate electrically. The platform and the corresponding opening in the bottom surface of the enclosure are larger than the aperture passing therethrough so as to define a flange extending around the aperture and resting on the platform when the enclosure is attached to the platform. A groove is formed in the bottom surface of the enclosure circumscribing the aperture and an elastomeric O-ring is positioned in the groove. In the case of a pair of semiconductors, two apertures are formed in the bottom surface in the enclosure overlaying the raised platform. A groove and a corresponding O-ring are positioned about the second aperture. A third groove is formed circumscribing both of the two apertures and an O-ring is placed in this third groove. The O-rings provide environmental isolation therebetween so that there is an environmentally isolated area formed on the bottom surface of the enclosure. This environmentally isolated area has a very high resistance to creep voltage thereby decreasing the creepage distance required to isolate the semiconductors from the grounded heat sink. In addition, the semiconductors are compressed onto the heat sink using a single bolt passing through the heat sink and into the enclosure and attached to a spring steel bar overlaying the semiconductors. The aperture through which the bolt passes in the enclosure is also provided with a groove and corresponding O-ring to again define additional isolated areas between the bolt and the high voltage of the semiconductors along the insulation surface between the enclosure and the heat sink. The spring steel bar allows a single bolt to be used to compress both of the semiconductors even though the semiconductors may require different magnitudes of compression. By adjusting the position in which the bolt passes through the spring steel bar and heat sink, the relative force exerted on each of the semiconductors can be adjusted. In particular, the force exerted on each of the semiconductors is inversely proportional to the distance between the semiconductors and the bolt. The invention thus provides a method and apparatus for reducing the required creepage distance and thus the size of the enclosure and heat sink for mounting power semiconductors while at the same time reducing the number of clamps needed to support the semiconductors to the heat sink and enclosure without sacrificing the ability to mount the semiconductors at different clamping pressures.

BRIEF DESCRIPTION OF THE DRAWINGS

For a better understanding of the present invention, reference may be had to the following detailed description taken in conjunction with the following drawings in which:

FIG. 4 is a schematic representation of the mounting arrangement of FIG. 1 illustrating the method of compressing the semiconductors against a heat sink.

DETAILED DESCRIPTION OF THE INVENTION

Figure 1:
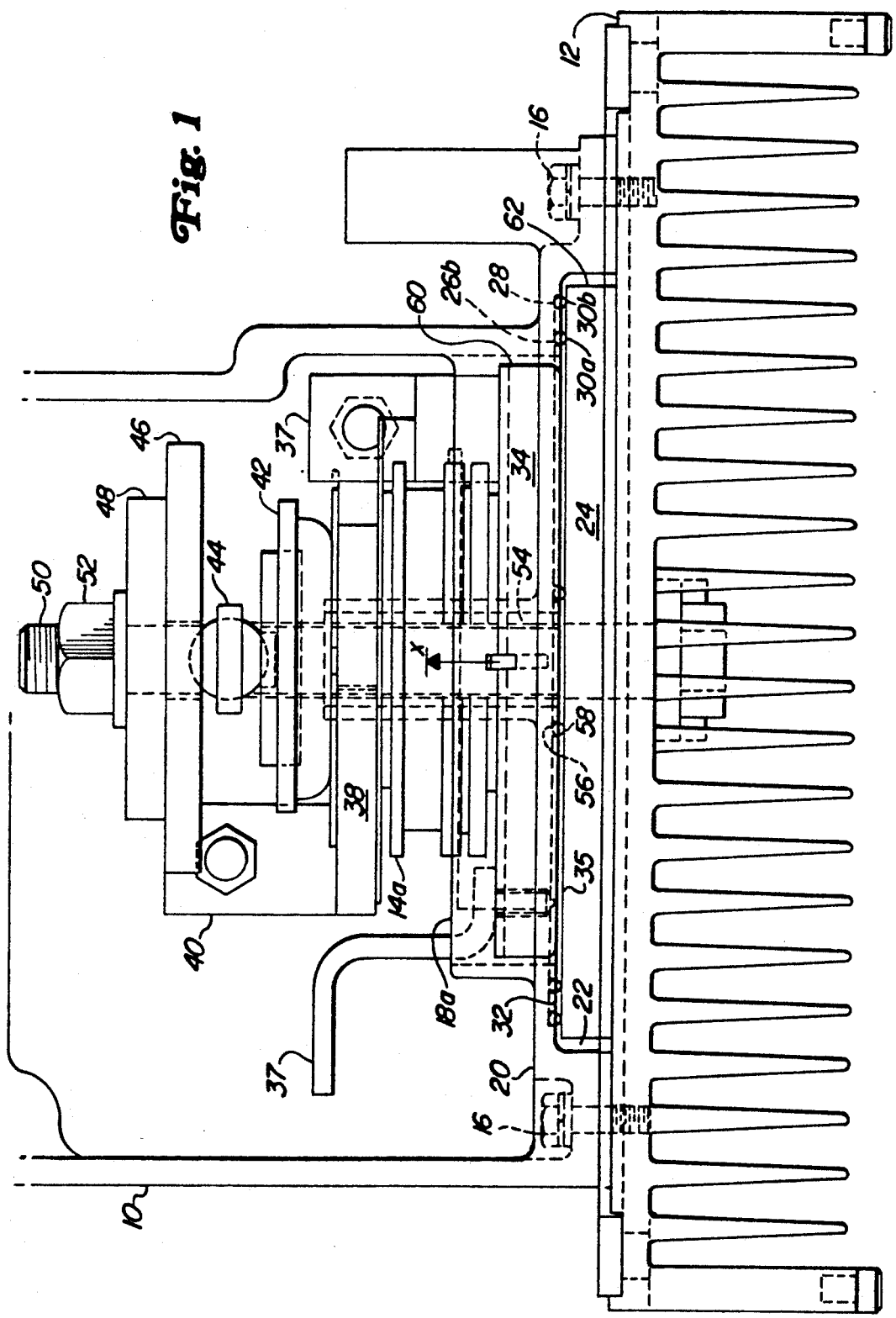
FIG. 1 is a cross-sectional view of a semiconductor mounting arrangement in accordance with the present invention.

Referring to the drawings generally and in particular to FIG. 1, there is shown a cross-sectional view of a semiconductor carrier or enclosure 10 positioned on a heat sink 12. A semiconductor 14, such as a gate turn-off thyristor, is mounted within the enclosure 10. The enclosure 10 is bolted to the heat sink at respective corners by means of bolts 16. A central opening 18 is formed in the enclosure for receiving the semiconductor and allowing the heat generated by the semiconductor to be transferred to the heat sink. The opening 18 is formed with a larger area on the surface of the enclosure abutting the heat sink than the area of the opening facing the semiconductor. The difference in area of the opening on the inner and outer surface of the enclosure defines a flange 20 which runs continuously about the opening 18. The portion of the opening abutting the heat sink surface, designated as 22, is sized to fit over a raised platform surface 24 formed integrally with the heat sink 12. A first groove 26 is formed around the flange 20 circumscribing the opening 18. A second groove 28 is formed outwardly of the first groove 26 and, in the case of an enclosure containing two semiconductors, would circumscribe both the opening shown in FIG. 1 and the additional opening required for a second semiconductor. A compressible electrically insulative material which may be formed into O-rings 30A, 30B is placed within each of the grooves 26 and 28, respectively. The height of the opening 22 and the height of the platform 24 are so selected that when the enclosure 10 is bolted to the upper surface of the heat sink 12, the O-rings 30A, 30B are compressed between the heat sink and the enclosure so as to provide an environmentally isolated space between the adjacent O-rings. In FIG. 1, the environmentally isolated space between the O-rings is indicated at 32.

In mounting the semiconductor 14 to the heat sink 12, it is necessary to provide a relatively large electrically conductive mounting block 34 against which one of the terminals of the semiconductor 14 can be compressed. The mounting block 34 is sized to fit within the opening 18 which serves to accurately position the block. However, since the terminals of the semiconductor 14 are generally at a relatively high potential while it is desirable to have the heat sink at a ground potential, it is necessary to electrically isolate the mounting block 34 from the heat sink 12. This is accomplished by placing a layer of a sheet insulator 35 over the raised platform 24 and between the platform 24 and the mounting block 34. The sheet of insulating material 35 is preferably a sheet of a boron nitride material with a silicon binder such as the type available under the trade name Chotherm. This material not only serves as the insulator but also provides good thermal transfer between the mounting block 34 and the platform 24 and is also somewhat compressible so as to provide good thermal contact over the entire surface adjacent the mounting block 34. The mounting block 34 also provides a surface area for coupling an electrical bus 37 to the semiconductor by attachment to the mounting block 34. The opposite end of the semiconductor 14 disposed away from the heat sink 12 is also compressed through an electrically conductive mounting plate 38 which includes an electrical bus attachment 40 for connection of electrical cabling to the upper terminal of the semiconductor 14A, 14B. The mounting plate 38 is pressed downward on the semiconductor 14 by an insulator 42 which is positioned on top of the mounting plate 38. Pressure is exerted on the upper surface of the insulator 42 through a ball joint 44 by an upper spring bar 46. The spring bar 46 is urged against the semiconductor by a load spreading center plate 48 and a bolt 50 extending through the bar 46 and center plate 48 and attached to the heat sink 12. The nut 52 at the top of bolt 50 can be tightened to control the pressure placed on the semiconductor 14 in urging it downward against the heat sink 12.

Figure 2:
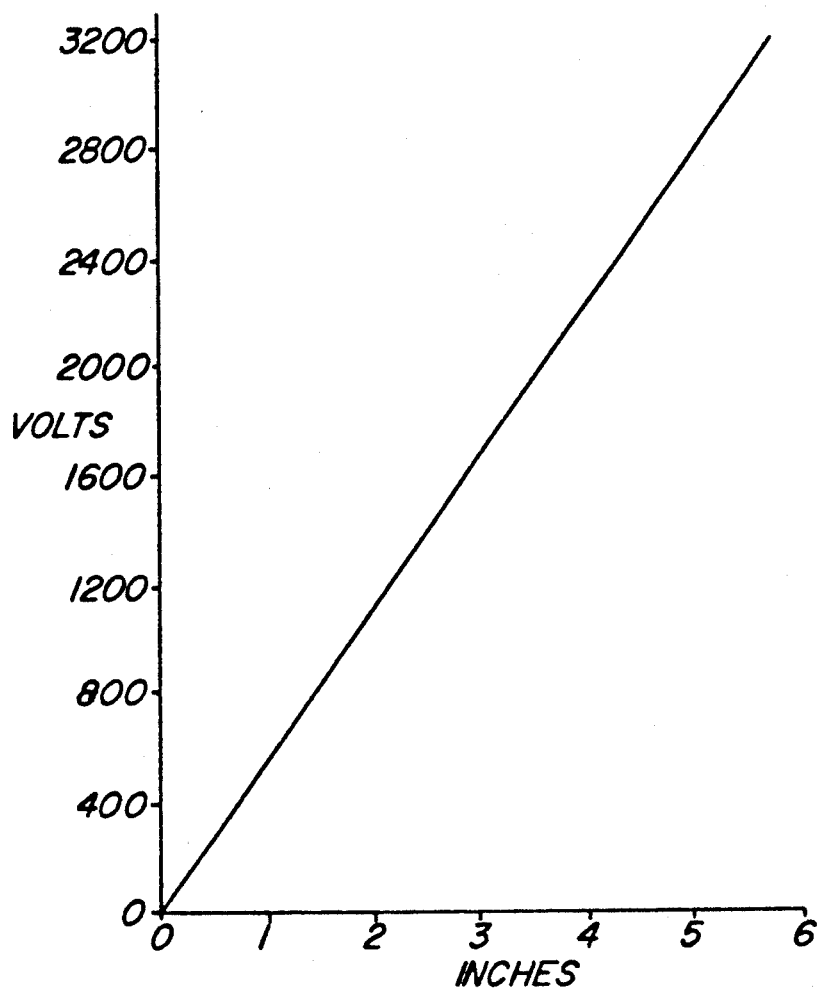
FIG. 2 is a graph of creepage distance as a function of voltage in a transit vehicle environment.

It will be noted that the bolt 50 extends from the lower surface of the heat sink 12 upwards through at least the lower surface of the enclosure 10 before engaging the spring bar 46. Because the bolt 50 passes through the enclosure 10, there is provided an aperture 54 in the lower surface of the enclosure 10 for passage of the metal bolt. Since it is desirable to isolate this metal bolt 50 against electrical creepage, another groove 56 is formed in the lower surface of the enclosure 10 circumscribing the opening 54 through which the bolt 50 passes. The groove 56 is filled with an O-ring 58 similar to the O-rings 30A, 30B. The enclosure 10 is constructed of a molded insulative material which is capable of providing sufficient strength for mounting the semiconductors and also providing the electrical insulation required to electrically protect the semiconductors. However, the various openings as described above through the lower surface of the enclosure 10 provide areas in which dust, moisture, or other environmental contaminants may enter and migrate along the surface of the insulator sheet 35. For this reason, it has been prior practice to require certain minimum distances between the edge of the mounting block 34 and the end of the insulation sheet 35 to minimize the opportunity for creepage to occur resulting in electrical breakdown of the system. Typically, for semiconductors operating at the 1000 volt range, the edge 60 of the mounting block 34 would necessarily have to be isolated at least two inches in a creepage distance from the edge 62 of the platform 24. This has resulted in enclosures and heat sinks of relatively large size in order to provide this minimum creepage distance. Referring briefly to FIG. 2, there is shown a chart which illustrates the minimum creepage distance required at different voltages in a transit vehicle environment. Note that as the voltage approaches 3000 volts, the minimum creepage distance allowable approaches six inches. Applicant has found that one method of reducing this creepage distance is to environmentally isolate sections of the surface of the insulator 35 to prevent contamination by moisture, dust, or other contaminants. In this regard, the O-rings 30A, 30B and 58 define environmentally isolated areas which are not subjected to contamination. If the semiconductor assembly is assembled in a clean room so that no dust or other contaminants are allowed to exist on the surface of the insulator at assembly, these environmentally isolated areas will serve to reduce the creepage distance required in order to isolate the voltage of the semiconductors from the ground potential on the heat sink. Applicant has found that a voltage of 1000 volts can be effectively isolated with a creepage distance of no more than 3/16 inch if the area along the insulator sheet is environmentally isolated.

Figure 3:
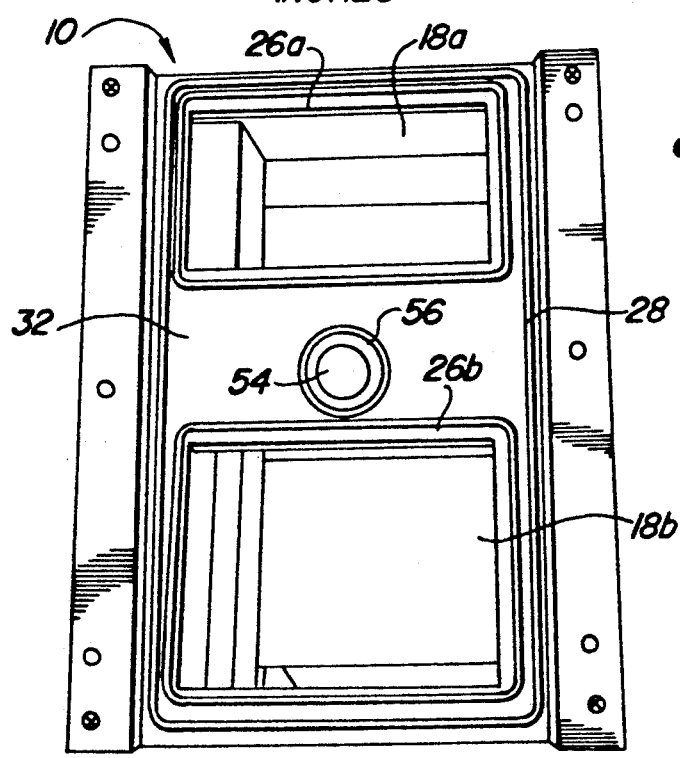
FIG. 3 is a planar view of a bottom portion of the enclosure of FIG. 1.

For a better understanding of the arrangement of the O-rings 30A, 30B and 58 and the corresponding grooves 26, A, 26B 28, 56, reference is made to FIG. 3 which is a bottom view of the enclosure 10 of FIG. 1 with the semiconductor 14 and its associated mounting and electrical connections omitted. As can be seen in the bottom view, each of the openings 18A, 18B, and 54 through the lower surface are circumscribed by a corresponding groove 26A, 26B, and 56. The aforementioned O-rings 30A, 30B and 58 are installed in these grooves to provide a seal to isolate each of the openings from the adjacent lower surface of the enclosure 10. An additional groove 28 is formed outside the openings which groove completely circumscribes the openings 18A, 18B, and 54, the first pair of grooves 26A, 26B associated with each of the respective openings 18A, 18B and, in addition, the third groove 56 circumscribing the center aperture 54 through which the bolt 50 passes for compressively attaching the semiconductors 14 to the heat sink 12. The space 32 between the seals is an environmentally isolated space in the sense that once the enclosure 10 has been attached to the heat sink 12, no dust, moisture, or other contaminants are allowed to enter into this space. Since the presence of dust and moisture has been found to be the primary source of voltage breakdown as a result of creepage, the illumination of this medium from the surface between the enclosure 10 and the heat sink 12 significantly reduces the required creepage distance. In the illustrative embodiment, it has been found that the actual distance between the O-ring 30A and the outer O-ring 30B can be reduced to 3/16 inch or less and still provide the required spacing to avoid voltage breakover due to creepage at voltages of about 1200 volts.

As was previously described, it is necessary to compress each of the semiconductors 14 against the heat sink 12 with sufficient force to ensure that contact is relatively uniform across the entire surface of the semiconductors. In this respect, the bolt 50 operates against the bar 46 to force the pair of semiconductors in the enclosure 10 firmly against the heat sink 12. Turning now to FIG. 4, there is shown one method of arrangement of the bar 46 and bolt 50 so as to provide for a distribution of the force exerted on each of the semiconductors 14A, 14B in any prescribed manner. In this arrangement, the spacing between the point at which the bolt 50 connects to the bar 46 and each of the adjacent semiconductors can be adjusted so that the force exerted on one of the semiconductors may be different from that exerted on the other of the semiconductors. In particular, it can be shown that the bar 46, which is formed of a heavy gauge spring steel, will exert a force on each of the semiconductors which is proportional to the relative distance between the point at which the bolt 50 connects to the bar 46 and each of the adjacent semiconductors 14A, 14B. For example, if the spacing to one side of the bolt 50 and the adjacent semiconductor is defined as L1 and the spacing to the other side of the bolt 50 and its adjacent semiconductor is defined as L2, the force exerted on each of the semiconductors is represented by the equation:

$$P_1 = \frac{P}{L_1 + L_2} (L_2),$$

where P is pressure exerted at the bolt 50, $P_1$ is the pressure exerted at one of the semiconductors 14A, $L_1$ is the distance from the one of the semiconductors to the bolt, and $L_2$ is the distance from the other of the semiconductors 14B to the bolt.

It will also be noted in this embodiment that the ball joints or ball struts 44 arranged on the top of each of the semiconductors allow the spring steel bar 46 to move in lateral directions without exerting a force on the insulators 42 which would cause a lateral force to be translated to the semiconductors 14A, 14B. Accordingly, the bolts 50 can be tightened down to any prescribed or desired pressure without affecting the position of the semiconductors 14A, 14B. It is preferable that the spreader plate 48 be utilized on top of the spring steel bar 46 in order to spread the force applied by the bolt 50. The bar 46 may be formed of spring steel material having a thickness of approximately 5/16 inch.

While the invention has been described in what is presently considered to be a preferred embodiment, various modifications and improvements will become apparent to those skilled in the art. It is intended therefore that the invention not be limited to the illustrative embodiment but be interpreted within the full spirit and scope of the appended claims.

What is claimed is:

1. A mounting arrangement for a pair of semiconductors positioned in spaced apart relationship on a support surface of a heat sink, the arrangement comprising:
    an electrically insulated enclosure having a mounting surface for operatively connecting the support surface of the heat sink to the enclosure:
    a pair of spaced openings extending through the mounting surface, each opening being configured for relatively accurately positioning a respective one of the semiconductors, each opening being circumscribed by a respective one of a pair of grooves with a third groove spaced from and circumscribing the pair of grooves on the mounting surface;
    compressible electrical insulation means, operatively positioned in each of the grooves, for forming a space between the grooves isolated from environmental contaminants when the enclosure is operatively connected to the heat sink;
    means for mounting one of the pair of semiconductors in each of the openings comprising:

an electrically conductive mounting plate, operatively positioned in each opening, electrically insulated from the heat sink and being operatively connected to each semi conductor;

a bar extending between the semiconductors, opposite ends of the bar being operatively connected to a respective one of the semiconductors;

means, operatively connecting the heat sink and the bar, for compressing the semiconductors between respective ends of the bar and the heat sink;

electrically insulative material positioned between each of the semiconductors and the bar;

an aperture, operatively positioned in the enclosure adjacent the heat sink, for operatively connecting the bar and the heat sink;

a fourth groove formed in the mounting surface of the enclosure abutting the heat sink, circumscribing the aperture and being circumscribed by the third groove; and a compressible electrical insulation means, operatively positioned in the fourth groove, for environmentally isolating the aperture from the space between the grooves when the enclosure is affixed to the heat sink.

2. A mounting arrangement for a pair of semiconductors comprising:

a heat sink having a support surface;

an enclosure, formed of electrically insulative material and having a mounting surface, for mating with the support surface of the heat sink;

a pair of spaced openings, extending through the mounting surface, for relatively accurately positioning a respective one of the semiconductors, each of the openings being circumscribed by a respective one of a pair of grooves with a third groove spaced from and circumscribing the pair of grooves on the mounting surface, the area between the pair of grooves and the third groove defining a space;

compressible electrical insulation means, operatively positioned in each of the grooves for isolating the space from environmental contaminants when the enclosure is operatively connected to the heat sink; and means for mounting one of the pair of semiconductors in each of the spaced openings.

3. The mounting arrangement of claim 2 wherein the mounting means further comprises:

an electrically conductive mounting plate positioned in each opening electrically insulated from the heat sink, the semiconductors being operatively positioned in electrical contact with a respective one of the mounting plates;

a bar extending between the semiconductors, opposite ends of the bar being operatively connected to a respective one of the semiconductors; and means coupled to the heat sink and the bar for tensioning the bar toward the heat sink and for compressing the semiconductors between respective ends of the bar and the heat sink.

4. The mounting arrangement of claim 3 wherein the tensioning means further comprises:

means, operatively positioned between the semiconductors such that the relative distance between each of the semiconductors and the tensioning means is inversely proportional to the force exerted by the tensioning means on each of the semiconductors.

5. The mounting arrangement of claim 4 further comprising:

means operatively positioned between each end of the bar and a respective one of the semiconductors, for absorbing motion of the bar in a direction normal to the direction of tensioning force applied by the bar during tensioning thereof.

6. The mounting arrangement of claim 5 including electrically insulative material positioned between each of the semiconductors and the bar.

7. The mounting arrangement of claim 6 further comprising:

a pair of raised platforms formed on the support surface of the heat sink, each of the raised platforms being aligned with a corresponding one of the openings in the enclosure, each of the openings being of a larger area on a surface of the enclosure abutting the heat sink than on a surface facing the semiconductors, the difference in surface area defining a flange extending into the opening from each side thereof, the grooves being formed in the flange for isolating the semiconductors from the heat sink.

8. The mounting arrangement of claim 7 wherein the pair of grooves circumscribing the openings are spaced about 3/16 inch from the outer groove at their closest points.

9. The mounting arrangement of claim 8 wherein the tensioning means further comprises:

an aperture formed in the surface of the enclosure adjacent the heat sink;

a bolt operatively positioned between the semiconductors, extending through the heat sink and the bar;

a fourth groove formed in the surface of the enclosure abutting the heat sink, the fourth groove circumscribing the aperture and being circumscribed by the third groove; and a compressible electrical insulation means positioned in the fourth groove for environmentally isolating the aperture from the space between the grooves when the enclosure is operatively connected to the heat sink.

10. A mounting arrangement for a pair of semiconductors positioned in spaced apart relationship on a support surface of a heat sink, the arrangement comprising:

electrical insulation means, overlaying the heat sink between each of the semiconductors and the heat sink, for transferring heat from the semiconductors to the heat sink;

a bar extending between the semiconductors, opposite ends of the bar being operatively connected to a respective one of the semiconductors; and means, coupled to the heat sink and the bar, for tensioning the bar toward the heat sink and for compressing the semiconductors between respective ends of the bar and the heat sink, the relative distance between each of the semiconductors and the tensioning means being inversely proportional to the force exerted by the tensioning means on each of the semiconductors.

11. The mounting arrangement of claim 10 further comprising:

means, positioned between each end of the bar and a respective one of the semiconductors, for absorbing motion of the bar in a direction normal to the direction of the tensioning force applied by the bar during tensioning thereof.

12. The mounting arrangement of claim 11 including electrically insulative material positioned between each of the semiconductors and the bar.

13. The mounting arrangement of claim 12 wherein the tensioning means further comprises:
   a bolt extending through the heat sink and being operatively connected to the bar between the semiconductors.

14. The mounting arrangement of claim 13 further comprising:
   an enclosure formed of electrically insulative material and having a mounting surface for mating with the support surface of the heat sink, a pair of spaced openings extending through the mounting surface for relatively accurately positioning a respective one of the semiconductors, each opening being circumscribed by a respective one of a pair of grooves with a third groove spaced from and circumscribing the pair of grooves on the mounting surface, the area between the grooves defining a space;
   compressible electrical insulation means, positioned in each of the grooves, for isolating the space from environmental contaminants when the enclosure is operatively connected to the heat sink; and
   means for mounting one of the pair of semiconductors in each of the spaced openings.

15. The mounting arrangement of claim 14 wherein the mounting means further comprises:
   a first electrically conductive mounting plate positioned in each of the openings and electrically insulated from the heat sink, one terminal of each of the semiconductors being positioned in electrical contact with the mounting plate;
   a second electrically conductive mounting plate positioned in electrical contact with the second terminal of each of the semiconductors; and
   first and second busses, operatively connected respectively to the first and second mounting plates for electrically coupling the semiconductors into an electrical circuit.

16. The mounting arrangement of claim 14 wherein the compressible insulation means comprises a plurality of O-rings.

17. The mounting arrangement of claim 14 further comprising:
   an aperture formed in the surface of the enclosure adjacent the heat sink for passing the bolt therethrough;
   a fourth groove formed in the surface of the enclosure abutting the heat sink, circumscribing the aperture and being circumscribed by the third groove; and
   a compressible electrical insulation means, positioned in the fourth groove, for environmentally isolating the aperture from the space when the enclosure is operatively connected to the heat sink.

* * * * *